US008232142B2

(12) United States Patent  
Steijer et al.

(10) Patent No.: US 8,232,142 B2  
(45) Date of Patent: Jul. 31, 2012

(54) SELF-ALIGNED SILICON CARRIER FOR OPTICAL DEVICE SUPPORTING WAFER SCALE METHODS

(75) Inventors: Odd Robert Steijer, Bromma (SE); Hans Magnus Emil Andersson, Järfälla (SE)

(73) Assignee: Tyco Electronics Services GmbH (CH)

( * ) Notice: Subject to any disclaimer, the term of this patent is extended or adjusted under 35 U.S.C. 154(b) by 63 days.

(21) Appl. No.: 12/558,824

(22) Filed: Sep. 14, 2009

(65) Prior Publication Data

US 2011/0062572 A1    Mar. 17, 2011

(51) Int. Cl.
*H01L 21/44* (2006.01)
*H01L 21/00* (2006.01)

(52) U.S. Cl. ......... 438/116; 438/48; 438/64; 438/462; 257/E23.116; 257/E25.032

(58) Field of Classification Search ............ 438/116, 438/48, 64, 462; 257/E23.116, 680, E25.032
See application file for complete search history.

(56) References Cited

U.S. PATENT DOCUMENTS

| | | | | |
|---|---|---|---|---|
| 6,571,466 | B1 * | 6/2003 | Glenn et al. | 29/841 |
| 6,825,065 | B2 * | 11/2004 | Moon et al. | 438/108 |
| 7,264,995 | B2 * | 9/2007 | Kim | 438/106 |
| 7,371,602 | B2 * | 5/2008 | Yee | 438/64 |
| 7,498,647 | B2 * | 3/2009 | Kirby et al. | 257/433 |
| 7,583,834 | B2 * | 9/2009 | McCollough et al. | 382/151 |
| 7,638,813 | B2 * | 12/2009 | Kinsman | 257/99 |
| 7,723,146 | B2 * | 5/2010 | Chow et al. | 438/64 |
| 2008/0224248 | A1 * | 9/2008 | Yang et al. | 257/433 |

* cited by examiner

*Primary Examiner* — Nitin Parekh  
(74) *Attorney, Agent, or Firm* — Laubscher & Laubscher PC (57) ABSTRACT

Disclosed is a carrier assembly for and a method of manufacturing an optical device. The method comprises providing a silicon substrate; attaching a number of optical dies on the silicon substrate to form an optical device carrier assembly; providing a corresponding number of through holes in the silicon substrate to permit the passage of light therethrough and further providing guide holes in the silicon substrate to present means for passive alignment of an external optical connection; and dicing the optical device carrier assembly to form individual optical devices. Preferably, the step of attaching a number of optical dies comprises using self-alignment of solder bumps using gaseous flux, the through holes are dry etched into the silicon substrate, and/or the volume between the optical die and silicon substrate is filled with a transparent polymer. Preferably, the transparent polymer is silicone rubber or epoxy. Preferably, the optical dies have a polymer mass to assist the heat transfer to the silicon substrate.

6 Claims, 9 Drawing Sheets

SELF-ALIGNED SILICON CARRIER FOR OPTICAL DEVICE SUPPORTING WAFER SCALE METHODS

FIELD OF THE INVENTION

The present invention relates to the field of optical devices. In particular, the invention relates to the design of a self-aligned silicon carrier for optical devices which supports wafer scale methods.

BACKGROUND OF THE INVENTION

There are numerous methods to produce an optical device including optical dies, such as a vertical-cavity surface-emitting laser (VCSEL). But in all cases they require four connections: the optical, the electrical, the thermal and the mechanical. Different applications require different approaches on how to balance these four connections.

When an optical device is produced, an optical die is mounted on and connected to a carrier. The mounting of an optical die to a carrier and coupling of light to optical fibres are both time consuming steps requiring micromechanical piece parts. Consequently, these steps are high cost steps in the production of an optical device.

Figure 1:
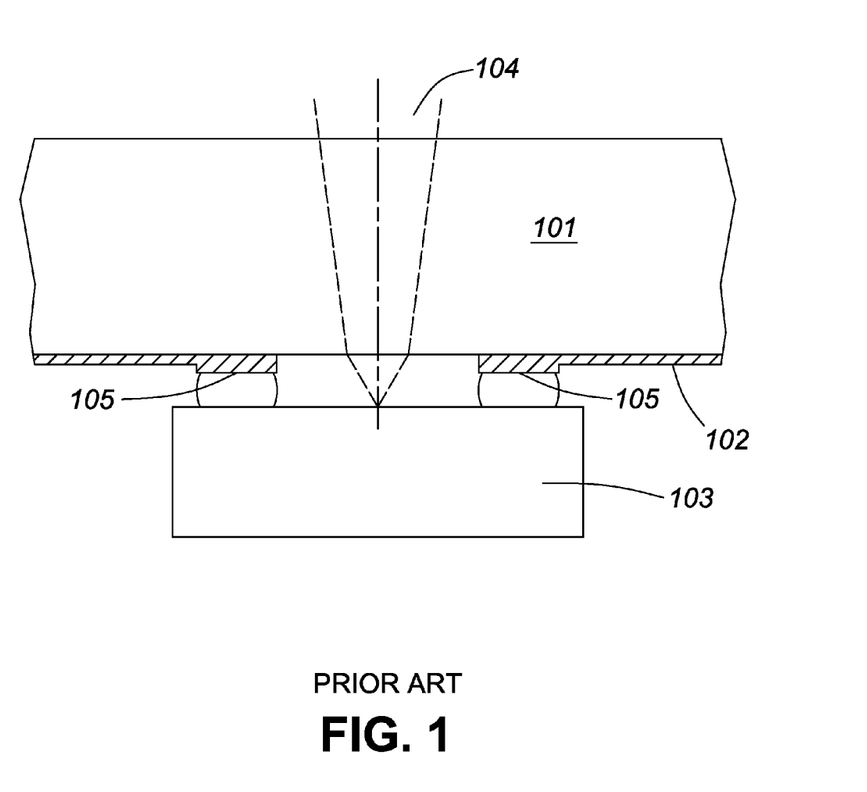
FIGS. 1 and 2 each illustrate an optical device as known in the art.

FIG. 1 illustrates an optical device comprising a transparent glass carrier 101 with a metalized pattern 102 for electrical connection and pads for epi down attachment of an optical die 103. The light 104 passes through the glass substrate 101. The position of the optical die 103 with respect to the metal pattern of the carrier is determined by self-alignment. For example, surface tension in liquid phase solder joints 105 could be used.

Figure 2:
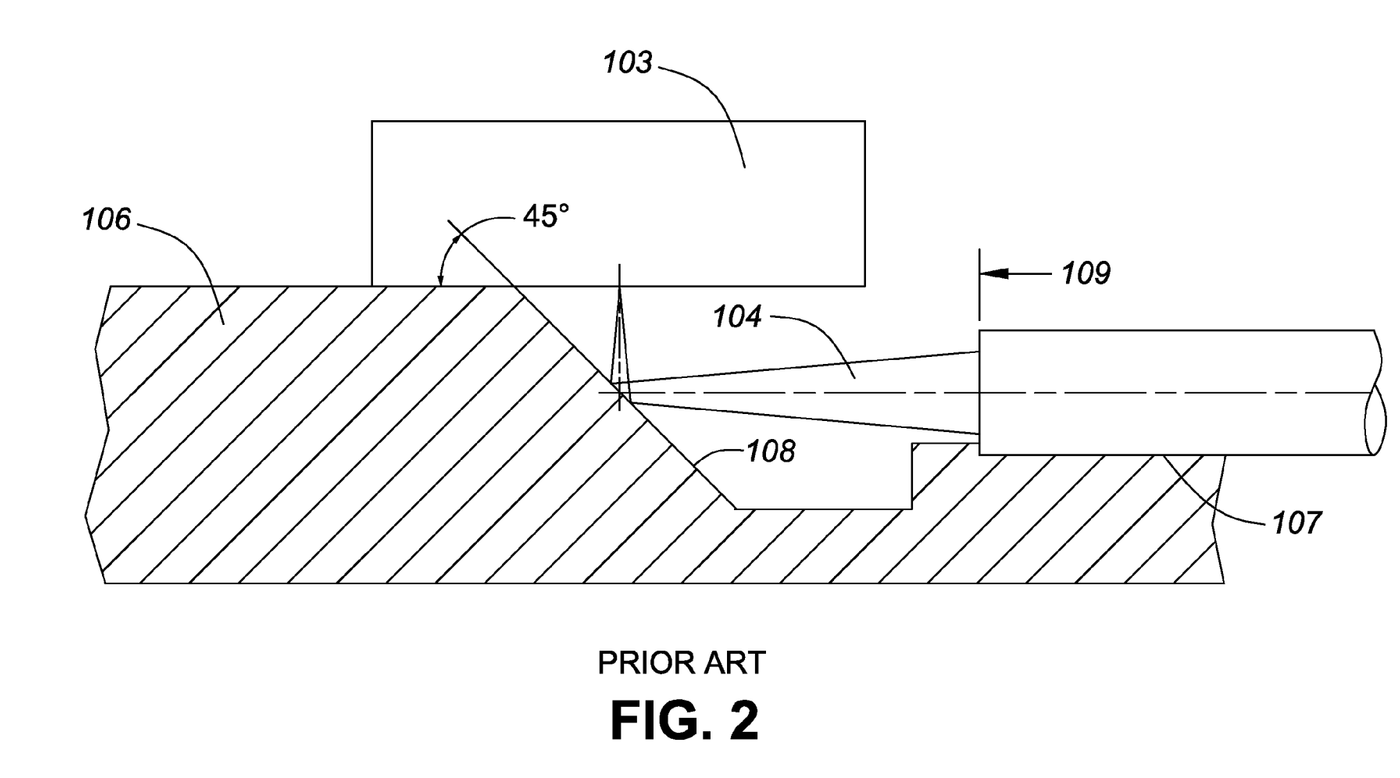

FIG. 2 illustrates an optical assembly comprising of an optical die 103 attached to a silicon carrier 106 with a groove 107 for fibre alignment. At the end of the groove there is a metalized mirror 108 reflecting the light 90 degrees (45 deg mirror) from/to optical die 103 to fibre end face 109.

One way to address the cost problem is to apply wafer scale methods to produce an optical device. Using a wafer scale method, a number of integrated circuits can be attached at the same time on a common slice of wafer. Once the fabrication process is complete, the wafer is divided into the individual devices.

However, each optical device needs to be tested prior to shipping. From a cost perspective, it is beneficial if the optical devices can be tested at the wafer scale stage (ie: before the wafer is divided into individual devices).

SUMMARY OF THE INVENTION

Embodiments of the present invention provide a self-aligned carrier design for an optical device supporting wafer scale methods for the assembly, the burn in and the HF electronic and optical testing. Embodiments of the present invention provide the advantage of micromechanical structure "through holes" for fiber alignment to an external optical connection provided by a silicon carrier that also takes advantage of optical transparency normally provided by a glass carrier. Embodiments of the invention exhibit "optical transparency" afforded by glass substrates in a silicon substrate, thereby also providing alignment micromechanical structures.

To effectively take advantage of a wafer scale assembly method, a number of optical dies are soldered to the silicon carrier substrate. According to embodiments of the present invention, this is achieved by solder pads deposited onto the surface of the optical die such that self alignment is achieved by surface tension in liquid phase solder bumps using gaseous flux. Still on wafer level, the optical dies are subjected to test and burn in, the substrate is then diced to separate carriers (including dies) to produce an optical device. Using such a wafer scale assembly permits a cost effective manufacturing method.

In an alternative embodiment, ICs can be assembled in parallel. The optical die on silicon can be effectively tested (with ICs) and approved/rejected on silicon wafer level before dicing the silicon carrier into separate optical devices. The wafer scale method offers parallel assembly, handling and test which is cost effective.

Embodiments of the invention provide a simple, easily manufacturable, passively aligned method of coupling an optical device to a fiber or fiber array. Passive and self correcting alignment methods of the optical device provide for an efficient and simple device to be added onto already existing components thus making its incorporation into the manufacturing process a desirable goal.

Thus, according to one aspect, the invention provides a method for manufacturing an optical device, the method comprising: providing a silicon substrate; attaching a number of optical dies on the silicon substrate by self-alignment of solder bumps to form an optical device carrier assembly; dry etching a number of corresponding through holes in the silicon substrate to permit the passage of light therethrough; filling the volume between the optical die and the silicon substrate with a transparent polymer; and dicing the optical device carrier assembly to form individual optical devices.

In another aspect, the invention provides a method for manufacturing an optical device, the method comprising: providing a silicon substrate; attaching a number of optical dies on the silicon substrate to form an optical device carrier assembly; providing a corresponding number of through holes in the silicon substrate to permit the passage of light therethrough; and dicing the optical device carrier assembly to form individual optical devices.

In one aspect, the step of attaching a number of optical dies comprises using self-alignment of solder bumps using gaseous flux. In one aspect, the through holes are dry etched into the silicon substrate. The method may also comprise the step of filling the volume between the optical die and silicon substrate with a transparent polymer, and the transparent polymer may be silicone rubber or epoxy.

In one aspect, the method further comprises testing and burn in of the optical dies prior to the dicing step. In one aspect, the method further comprises providing the optical dies with a polymer mass to assist the heat transfer to the silicon substrate. In one aspect, the method may comprise providing guide holes in the silicon substrate to permit passive alignment of the optical carrier to an external optical element. In one aspect, the method may comprise providing a metal pattern on the silicon substrate and solder bumps on an epi side of each optical die, and wherein the step of mounting the optical dies to the substrate includes mating together the metal pattern and the solder bumps.

In another aspect, the invention provides an optical carrier of an optical device, the optical carrier comprising: a silicon substrate, an optical die mounted to the silicon substrate; and at least one through hole in the silicon substrate to permit the passage of light though the silicon substrate. The silicon substrate may comprise guide holes to permit passive alignment of the optical carrier to an external optical element. The silicon substrate may include an metal pattern and the optical die has an epi side having solder bumps, the metal pattern and the solder bumps mating together to mount the optical die to the silicon substrate. The optical die may be mounted to the silicon substrate and aligned by surface tension in liquid phase solder.

In one aspect, the optical carrier may comprise a transparent polymer fill between the optical die and the silicon substrate. The transparent polymer may be silicone rubber or epoxy. The optical carrier may comprise a polymer mass on the optical die to permit heat transfer to the silicon substrate.

By the self alignment of optical die (surface tension in solder bumps) in combination with high precision etched through holes for guide pin based alignment of the optical fiber connection facilitates optical coupling and excludes high cost micro machined piece parts. The wafer scale method itself, offers parallel assembly, handling and test which is cost effective Embodiments of the invention disclosed provide a simple, easily manufacturable, passively aligned method of coupling an optoelectronic device to a fiber or fiber array with most steps integrated at the wafer level. The passive and self correcting feature of the alignment method provides for an efficient and simple component to be added onto already existing components thus making its incorporation into the manufacturing process a desirable goal.

Other aspects and advantages of embodiments of the invention will be readily apparent to those ordinarily skilled in the art upon a review of the following description.

BRIEF DESCRIPTION OF THE DRAWINGS

Embodiments of the invention will now be described in conjunction with the accompanying drawings, wherein:

FIGS. 4a and 4b illustrate the assembly of an optical die to the silicon carrier of the present invention. More specifically.

FIGS. 6a, 6b and 6c illustrate alternative embodiments of the present invention in accordance with the teachings of this invention; More specifically.

This invention will now be described in detail with respect to certain specific representative embodiments thereof, the materials, apparatus and process steps being understood as examples that are intended to be illustrative only. In particular, the invention is not intended to be limited to the methods, materials, conditions, process parameters, apparatus and the like specifically recited herein.

DETAILED DESCRIPTION OF THE DISCLOSED EMBODIMENTS

Embodiments of the invention provide a carrier design assembly of an optical device. In accordance with the teachings of this invention, the carrier comprises a silicon micromechanical substrate. The silicon substrate is provided with a set of through holes that permit light to pass and serves as micromechanical structures for passive alignment to an external optical connection.

Generally silicon offers excellent properties as carrier for optical die and electrical circuits. The properties include high definition micromechanical structuring by dry etching; high definition metal patterning by a combination of metal deposition and lithography (electrodes) and electroplating (solder bumps); high accuracy between mechanical structures and the metal pattern (approx. 1 micron); good thermal properties, ie: thermal conductivity; good HF properties; and batch handling and parallel processing supporting low piece part cost.

Figure 3A:
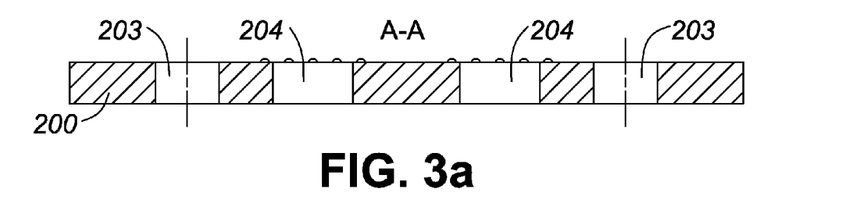
FIGS. 3a and 3b illustrate a silicon micromechanical carrier in accordance with the teachings of the present invention.
Figure 3B:
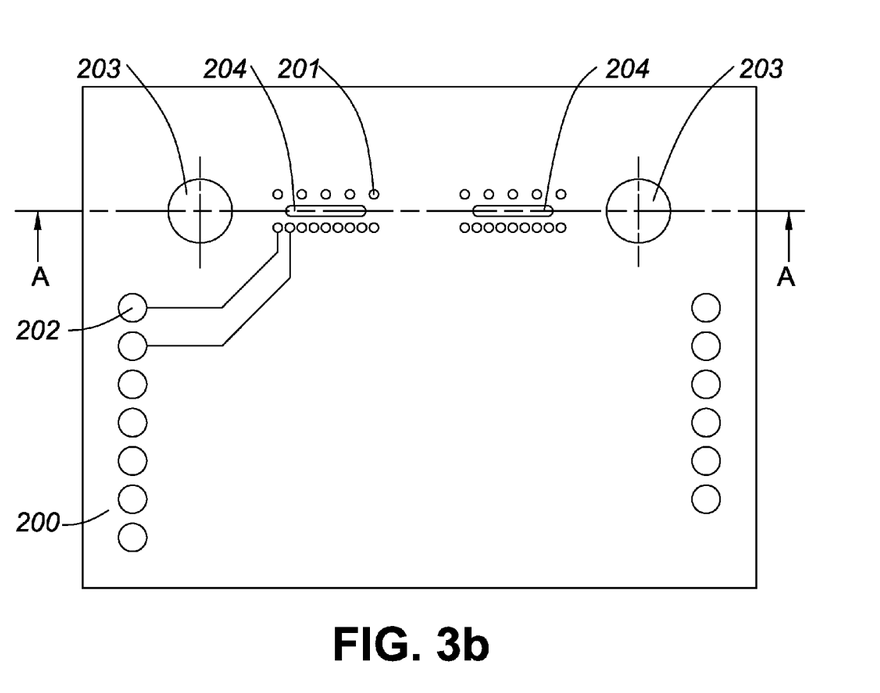

Referring to FIGS. 3a and 3b, a silicon substrate in accordance with the teachings of this invention includes a metal pattern including pads 201 for connecting an optical die (not shown in this figure) to the silicon substrate 200 periphery. The metal pattern includes pads for optical die attachment 201 and pads with solder bumps 202 for connecting the silicon substrate 200 externally (for example a printed circuit board—not shown). It should be noted that an ASIC can be placed in this path and be connected by solder bumps. The silicon substrate 200 includes electrical pattern and connections (solder pads) compatible with standard well-established flip-chip ASIC assembly method.

The substrate 200 also includes guide holes 203 for passive alignment to facilitate mechanical matching to a fibre holding fixture. Guide holes 203 are defined with micron range accuracy for passive alignment of an optical system. These holes are used together with a mating structure to position a lens or a light-guiding device. An example of such a suitable mating structure is guide pins.

Through-holes 204 are provided to let light pass through the silicon substrate 200. To obtain high positional accuracy between optical die 103 (seen in FIG. 4) and the metal pattern on the silicon substrate 200, the epi-side of the optical die 103 faces the silicon metal pattern. The positional matching of the optical die 103 and the silicon pads are a result of self-alignment to pads 201 by surface tension in liquid phase solder. These bumps are deposited onto the surface of the optical die 103. As a consequence of this geometry the light is emitted directly against the surface of silicon substrate 200, and permits passage of light through the opening 204 in the silicon substrate.

Figure 4A:
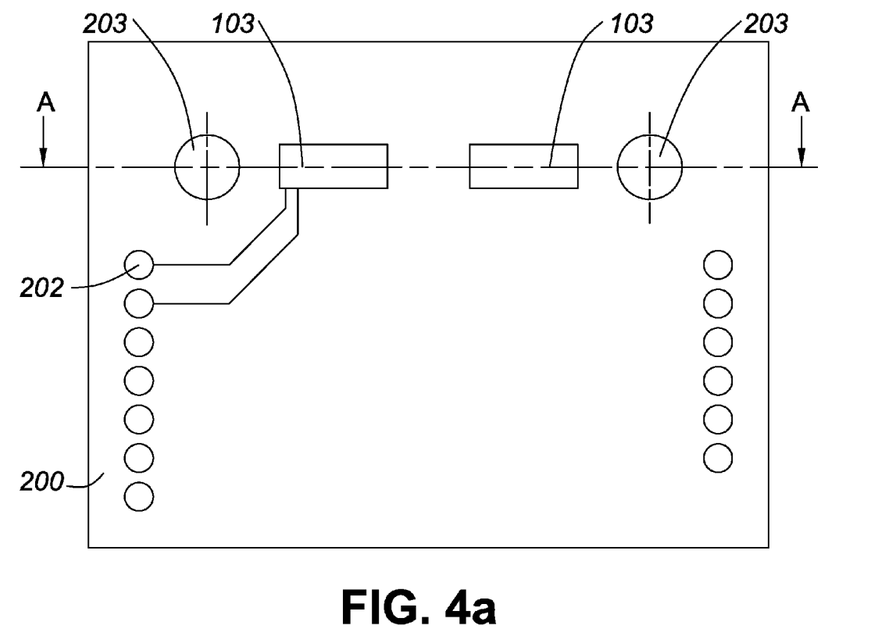
Figure 4B:
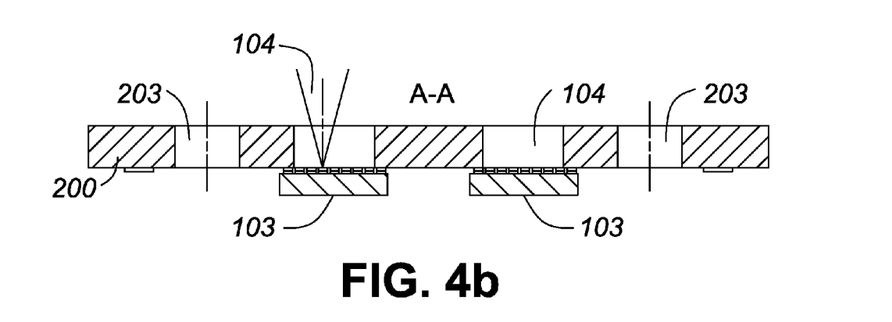
FIG. 4b shows a cross-section with through holes for light passage and mechanical alignment to external optical connection.

Referring to FIGS. 4a and 4b, the assembly geometry of the optical die 103 to silicon substrate 200 to form a carrier assembly in accordance with the teachings of this invention is illustrated. The optical die 103 is attached onto the silicon substrate 200 and the light 104 is passing through holes 204 in the silicon substrate. Due to high precision wafer patterning and self-alignment, the relative positional accuracy between the active area of the optical die 103 and the silicon guide holes 203 is very good. The present inventors have been able to achieve self-alignments of better than 5 microns. The passive optical connection is made by an optical element (lenses or a fibre fixture—not shown) with mating pins that fits to the silicon substrate guide holes 203.

Figures 5A, 5B:
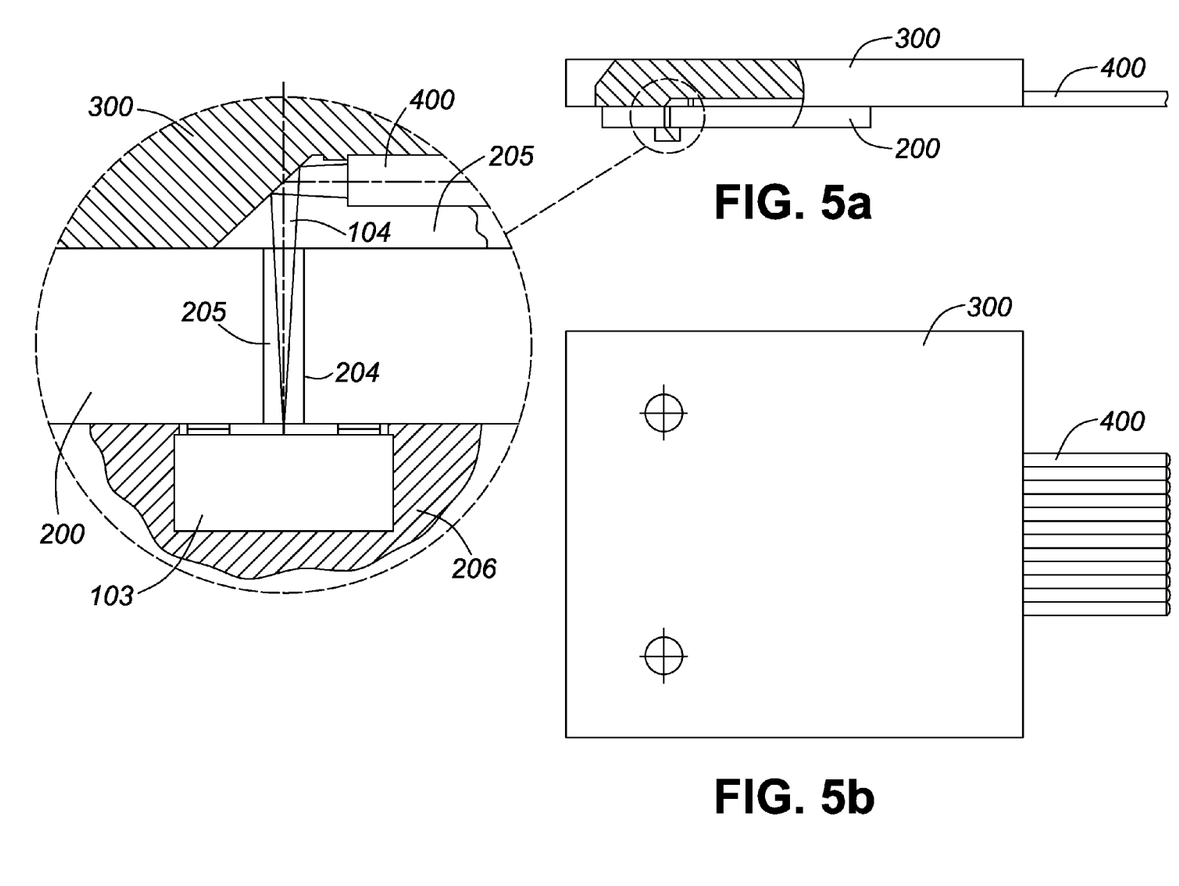
FIGS. 5a and 5b illustrate a mechanical protection, an optical and thermal connection of an optical carrier in accordance with the teachings of this invention.

Referring to FIGS. 5a and 5b, the mechanical protection and thermal connection of the carrier design in accordance with the teachings of this invention are shown. To protect the sensitive epi side of the optical die 103, the through-hole 204 and the volume between the optical die and the silicon substrate 200 is filled with a transparent polymer 205. Examples of suitable polymers include silicone rubber or epoxy 205.

In combination with a fiber-coupling fixture 300 according to known methods, this arrangement offers a light path which is from optical die 103 to fibre tip 400, completely filled with a transparent polymer 205. This is beneficial in applications where there is risk of contamination or condensed water on refractive surfaces. The fiber coupling fixture is equipped with guide holes matching the guide holes on the silicon substrate. The two parts are aligned by guide pins (not shown).

A thick lump or mass of polymer 206 is provided to deal with high thermal resistance at the metal pads on the optical die. The polymer mass 206 permits heat transfer to the silicon substrate 200. The polymer mass top 206 is dispensed onto the optical die 103. The heat is spread through the mass 206 top down to the silicon substrate 200. This is normally not needed for a flip chip attached ASIC since the bond surfaces serves as numerous thermal paths securing acceptable heat dissipation. Besides from establishing a thermal path to the outside, the mass 206 top also mechanically protects the chip.

Figure 8:
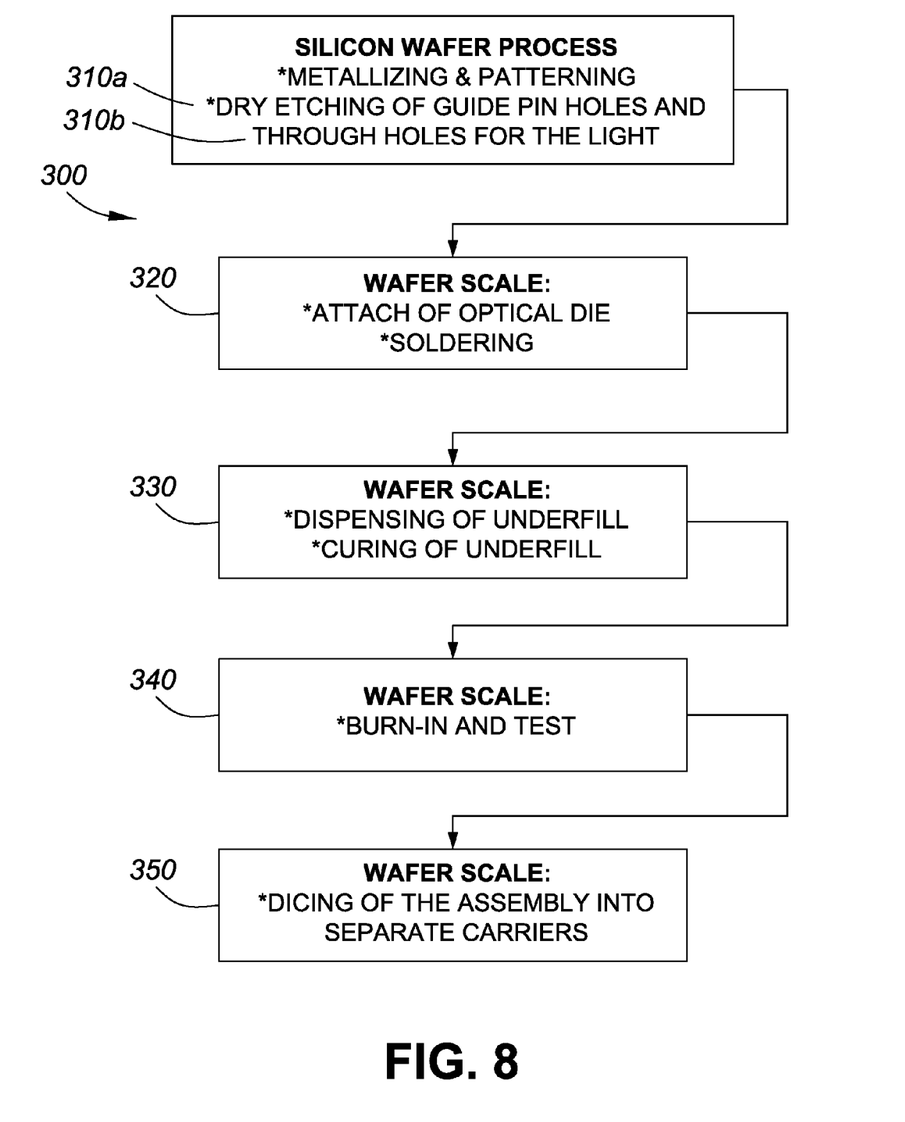
FIG. 8 is a flow chart of the fabrication steps for an optical carrier in accordance with the teachings of this invention.

FIG. 8 illustrates a broad flow chart of steps in a method 300 of manufacturing an optical device in accordance with these teachings. In steps 310a and 310 b, the silicon wafer substrate is metallized and patterned with solder bumps (step 310 a) and the guide pin holes and through holes are dry etched (step 310b). In step 320, at a wafer scale method, the optical die is attached by soldering. Also at a wafer scale, in step 330, underfill is dispensed and cured. In step 340, also a wafer scale, the units undergo burn in and testing. In step 350, approved optical dies or units are diced into separate optical devices.

In a preferred embodiment of the method, alignment between optical dies, integrated circuits and the silicon carrier is done by self alignment based on surface tension force in liquid solder bumps assisted by gaseous flux at specific temperatures to mount the dies. For example, eutectic AuSn @+280 deg C. and eutectic AgSn @+220 degC. respectively.

Figure 6A:
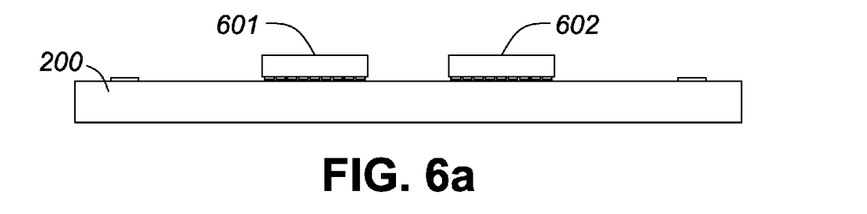
FIG. 6a is a side view, 6b is a top view
Figure 6B:
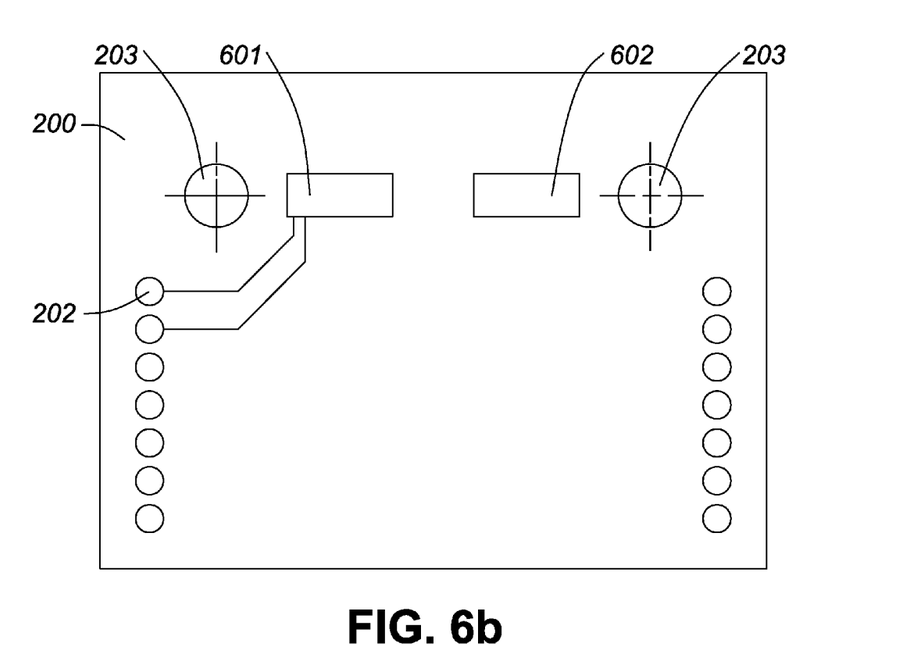
Figure 6C:
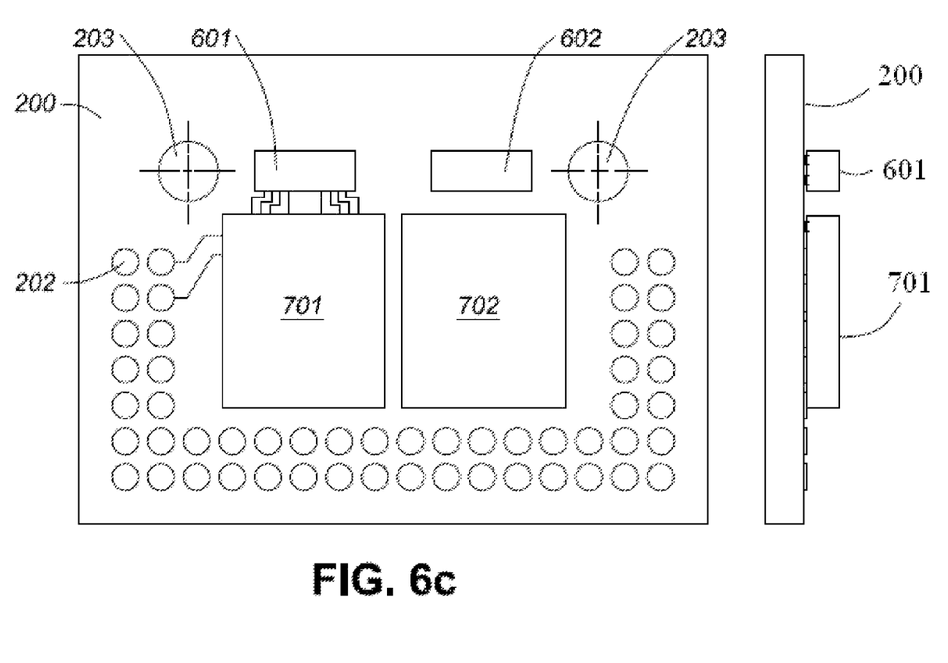
FIG. 6c shows a version including an IC chip set for transmitting and receiving of signals.
Figure 7A:
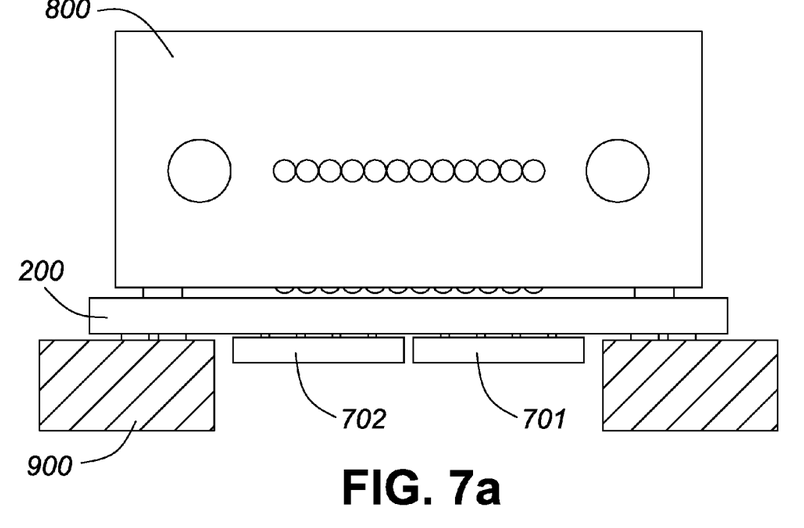
FIGS. 7a and 7b illustrate an alternative embodiment of the present invention in accordance with the teachings of this invention also including a commercially available array lens element with mechanical interface for optical fiber connection.
Figure 7B:
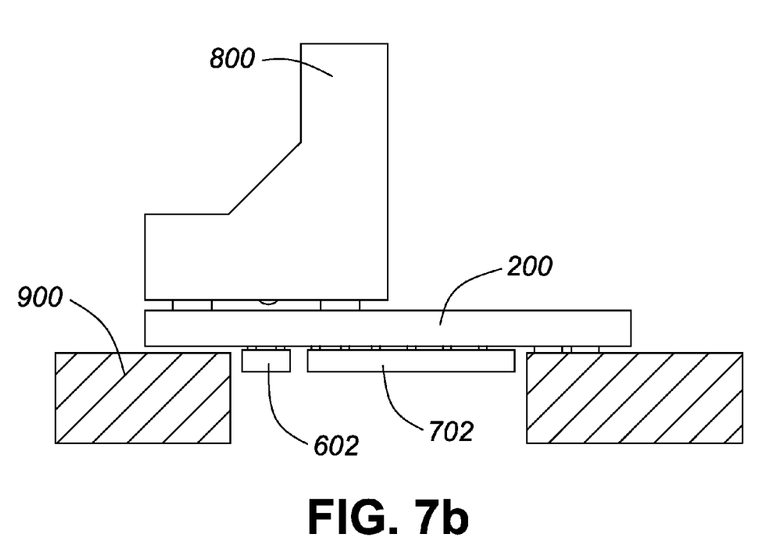

FIGS. 6a, 6b and 6c illustrate alternative embodiments of the invention in accordance with the teachings of this invention. FIGS. 6a (side view) and 6b (top view) show an array type design including two optical dies, one 4-channel transmitter 601 and one 4-channel receiver 602. FIG. 6c shows basically the same, but with electronics added, one transmitter 701 and one receiver 702 ASIC. FIG. 7 illustrates the assembly of FIG. 6c with a standard type array lens 800 attachment on top side and the reverse side connected to a PCB 900.

Numerous modifications may be made without departing from the spirit and scope of the invention as defined in the appended claims.

What is claimed is:

1. A method for manufacturing an optical device, the method comprising:
providing a silicon substrate; attaching a number of optical dies on the silicon substrate to form an optical device carrier assembly, wherein the step of attaching a number of optical dies comprises using self-alignment of solder bumps using gaseous flux; dry etching a corresponding number of through holes into the silicon substrate to permit the passage of light therethrough; dicing the optical device carrier assembly to form individual optical devices; and using the through holes as guide holes to permit passive fiber alignment of the optical carrier to an external optical element in use, wherein guide pins are used to align the through holes in the silicon substrate with corresponding guide holes in the external optical element; whereby the through holes serve to provide both optical transparency in the silicon substrate and serve to provide a micromechanical structure for passive fiber alignment.

2. The method of claim 1, further comprising the step of filling the volume between the optical die and silicon substrate with a transparent polymer.

3. The method of claim 2, wherein the transparent polymer is silicone rubber or epoxy.

4. The method of claim 1, further comprising testing and burn in of the optical dies prior to the dicing step.

5. The method of claim 1, further comprising providing the optical dies with a polymer mass to assist the heat transfer to the silicon substrate.

6. The method of claim 1, further comprising providing a metal pattern on the silicon substrate and solder bumps on an epi side of each optical die, and wherein the step of mounting the optical dies to the substrate includes mating together the metal pattern and the solder bumps.

* * * * *